United States Patent
Shi et al.

(10) Patent No.: US 12,516,421 B2
(45) Date of Patent: Jan. 6, 2026

(54) BARRIER CHEMICAL MECHANICAL PLANARIZATION SLURRIES FOR COBALT FILMS

(71) Applicant: Versum Materials US, LLC, Tempe, AZ (US)

(72) Inventors: Xiaobo Shi, Chandler, AZ (US); James A. Schlueter, Phoenix, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/203,925

(22) Filed: Mar. 17, 2021

(65) Prior Publication Data

US 2021/0301405 A1   Sep. 30, 2021

Related U.S. Application Data

(60) Provisional application No. 62/994,650, filed on Mar. 25, 2020.

(51) Int. Cl.
| | |
|---|---|
| *C09G 1/02* | (2006.01) |
| *C23F 3/06* | (2006.01) |
| *H01L 21/321* | (2006.01) |

(52) U.S. Cl.
CPC ............ *C23F 3/06* (2013.01); *H01L 21/3212* (2013.01); *C09G 1/02* (2013.01)

(58) Field of Classification Search
None
See application file for complete search history.

(56) References Cited

U.S. PATENT DOCUMENTS

| | | | |
|---|---|---|---|
| 2007/0181534 A1 * | 8/2007 | Kamimura | H01L 21/7684 438/692 |
| 2009/0173910 A1 * | 7/2009 | Hirano | C09G 1/02 252/79.1 |
| 2013/0140273 A1 | 6/2013 | Lu et al. | |
| 2013/0186850 A1 | 7/2013 | Wang et al. | |
| 2015/0104941 A1 * | 4/2015 | Graham | C09K 3/1463 438/693 |
| 2016/0108286 A1 | 4/2016 | Sikma et al. | |
| 2018/0340094 A1 * | 11/2018 | Liang | H01L 21/3212 |

FOREIGN PATENT DOCUMENTS

| | | | | |
|---|---|---|---|---|
| EP | 3628714 A1 * | 4/2020 | | B24B 37/005 |
| WO | WO-2019030827 A1 * | 2/2019 | | B24B 37/00 |

OTHER PUBLICATIONS

WO-2019030827-A1 (translation) (Year: 2019).*

* cited by examiner

*Primary Examiner* — Roberts P Culbert
(74) *Attorney, Agent, or Firm* — Daniel Roth; Versum Materials US, LLC

(57) ABSTRACT

Cobalt barrier Chemical Mechanical Planarization (CMP) compositions, systems and methods are provided for the removal of cobalt or a cobalt alloy from the surface of a semiconductor device during its manufacture. The compositions use suitable chemical additives selected from the group consisting of an aliphatic organic carboxylic acid, an aromatic organic carboxylic acid, and combinations thereof; abrasives; an oxidizing agent; and an corrosion inhibitor; to provide tunable cobalt film removal rates, tunable selectivity between cobalt and dielectric or other barrier films, and maintain very low static etching rates on cobalt film.

18 Claims, No Drawings

BARRIER CHEMICAL MECHANICAL PLANARIZATION SLURRIES FOR COBALT FILMS

CROSS REFERENCE TO RELATED PATENT APPLICATIONS

This application claims the benefit of priority under 35 U.S.C. § 119 (e) to earlier filed U.S. patent application Ser. Nos. 62/994,650 filed on Mar. 25, 2020, which is entirely incorporated herein by reference.

BACKGROUND OF THE INVENTION

The present disclosure relates to barrier chemical mechanical planarization ("CMP") polishing compositions (or slurries) used in the production of a semiconductor device, and polishing methods and systems for carrying out chemical mechanical planarization. In particular, the present disclosure relates to barrier polishing compositions that are suitably used for polishing patterned semiconductor wafers that include metallic cobalt and/or a cobalt alloy.

In the semiconductor industry, chemical mechanical polishing (abbreviated as CMP) is a well-known technology applied in fabricating advanced photonic, microelectromechanical, and micro-electronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational, or orbital.

In a typical CMP process step, a rotating wafer holder brings the to-be-polished wafer in contact with a polishing pad. The CMP composition is usually applied between the to-be-polished wafer and the polishing pad.

As industry standards trend toward smaller device features, there is a continuing need for barrier CMP slurries that deliver superior planarization of the nanostructures of IC chips. Specifically, for 22 nm technology nodes and beyond, slurry products must deliver tunable removal rate and tunable selectivity between metal and dielectric and reduce the erosion and dishing while maintaining sufficient removal rates. Also, the continued trend toward smaller device features demands the introduction of new types of barrier layer materials. Cobalt has been considered and tested as one of the promising new type of barrier layer materials in IC Chip integration. The properties of cobalt have different properties relative to traditional barrier materials such as tantalum (Ta) or titanium (Ti). Therefore, new CMP polishing compositions are needed to be developed to polish Co barrier films in IC chip production processes.

Due to the different electrochemical properties of cobalt, there is also a strong need to optimize the cobalt barrier CMP polishing compositions through formulation design and additive selection to minimize or eliminate the possible galvanic corrosion at the Co/Cu interface. It is also very important to have efficient corrosion protection on Co film surfaces during and after a Co barrier CMP process. Therefore, to achieve low SER (static etch rate) in Co barrier CMP polishing, composition balance is one essential condition to meet. Static etch rate is a measurement that provides empirical data related to the chemical activity level of a CMP slurry. Typically, a higher static etch rate is indicative of a more aggressive chemical composition that leads to the relative fast etching of the related metal film surfaces, with a higher probability of causing more metal corrosion defects.

Thus, there is a need in the art for a CMP composition that can provide desirable cobalt film removal rates while, at the same time, achieving very low static etch rates.

BRIEF SUMMARY OF THE INVENTION

The cobalt barrier CMP slurry composition described herein satisfies the need for tunable Co film removal rates, tunable selectivity between cobalt and dielectric, and for lower static etching rates. The general composition of the cobalt barrier CMP slurry compositions disclosed herein consists of the nano-sized colloidal silica particles, and the selected suitable chemical additives, and a selected suitable oxidizing agent, typically hydrogen peroxide.

Described herein are barrier CMP polishing compositions, methods, and systems for the CMP processing. In one aspect, the disclosed herein is a CMP composition comprising, consisting essentially of, or consisting of: water; an oxidizing agent; an abrasive comprising nano-sized particles selected from the group consisting of silica, alumina, ceria, germania, titania, zirconia, alumina-doped silica, and mixtures thereof; an aliphatic organic carboxylic acid selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof; or and an aromatic organic carboxylic acid selected from the group consisting of picolinic acid, mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof; a corrosion inhibitor selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof; and, optionally, a surfactant; a pH adjusting agent, wherein the polishing composition has a pH of from about 2 to about 12, about 7 to about 11.5, or from about 9 to about 11.

In another aspect, disclosed herein is a polishing method of selective chemical mechanical polishing comprising: a) providing a semiconductor substrate having a surface containing a first material and at least one second material; wherein the first material is Co and the second material is at least one selected from the group consisting of dielectric film, low-k and ultra-low-k film, and barrier film; b) providing a polishing pad; c) providing a chemical mechanical polishing composition comprising, consisting essentially of or consisting of: water; an oxidizing agent; an abrasive comprising nano-sized particles selected from the group consisting of silica, alumina, ceria, germania, titania, zirconia, alumina-doped silica, and mixtures thereof; an aliphatic organic carboxylic acid selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof; and an aromatic organic carboxylic acid selected from the group consisting of picolinic acid, mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof; a corrosion inhibitor selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof; and, optionally, a surfactant; a pH adjusting agent, wherein the polishing composition has a pH of from about 2 to about 12, about 7 to about 11.5, or from about 9 to about 11; and d) polishing the surface of the semiconductor substrate to selectively remove the first material, wherein Co is a metal inter-connection material, at least a portion of the surface is in contact with both the polishing pad and the chemical mechanical polishing composition, and ratio of removal rate of the first material to removal rate of the second material is greater than 1.

In yet another aspect there is provided a method for chemical mechanical planarization of a semiconductor device comprising at least one surface comprising cobalt or a cobalt alloy, the method comprising the steps of: a. contacting the at least one surface comprising cobalt or a cobalt alloy with a polishing pad; b. delivering to the at least one surface comprising cobalt or a cobalt alloy a polishing composition comprising, consisting essentially of or consisting of: water; an oxidizing agent; an abrasive comprising nano-sized particles selected from the group consisting of silica, alumina, ceria, germania, titania, zirconia, alumina-doped silica, and mixtures thereof; an organic carboxylic acid selected from the group consisting of (1) an aliphatic organic carboxylic acid selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof; (2) an aromatic organic carboxylic acid selected from the group consisting of picolinic acid, mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof; and (2) combinations of (1) and (2); a corrosion inhibitor selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof; and, optionally, a surfactant; a pH adjusting agent, wherein the polishing composition has a pH of from about 2 to about 12, about 7 to about 11.5, or from about 9 to about 11; and c. polishing the at least one surface comprising cobalt or a cobalt alloy with the polishing composition to at least partially remove the at least one surface comprising cobalt or a cobalt alloy.

In yet another aspect there is provided a system for chemical mechanical planarization of semiconductor device comprising: a semiconductor device comprising at least one surface, wherein the at least one surface has (1) a barrier layer comprising cobalt or a cobalt alloy; (2) an interconnect metal layer selected from the group of copper, tungsten, cobalt, aluminum, or their alloys; and (3) a porous or non-porous dielectric layer, a polishing pad; and the chemical mechanical polishing (CMP) composition disclosed above.

The embodiments of the invention can be used alone or in combinations with each other.

DETAILED DESCRIPTION OF THE INVENTION

Chemical mechanical polishing (CMP) compositions (or CMP slurries), methods and system for polish cobalt or cobalt-containing substrates are disclosed herein.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention, and does not pose a limitation on the scope of the invention unless otherwise claimed. No language in the specification should be construed as indicating any non-claimed element as essential to the practice of the invention. The use of the term "comprising" in the specification and the claims includes the narrow language of "consisting essentially of" and "consisting of."

Embodiments are described herein, including the best mode known to the inventors for carrying out the invention.

Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

"Substantially free" is defined herein as less than 0.001 wt. %. "Substantially free" also includes 0.000 wt. %. The term "free of" means 0.000 wt. %.

As used herein, "about" is intended to correspond to +5%, preferably +2% of the stated value.

In all such compositions, wherein specific components of the composition are discussed in reference to weight percentage ranges including a zero as lower limit, it will be understood that such components may be present or absent in various specific embodiments of the composition, and that in instances where such components are present, they may be present at concentrations as low as 0.00001 weight percent, based on the total weight of the composition in which such components are employed.

With the disclosed combination of chemical components, the Co bulk CMP polishing compositions are able to provide desirable high and tunable Co film removal rates; low barrier film and dielectric film removal rates; reduced Co film static etch rates (SER) for better Co film corrosion protection; high and desirable removal selectivity of cobalt vs. dielectric films such as TEOS, SiNx with x ranging 1.0<x<1.5, low-k, and ultra-low-k films, and cobalt vs. barrier films such as Ta, TaN, Ti, and TiN films; and minimized or eliminated the possible galvanic corrosion at Co/Cu interface by tuning open circuit potentials of both Co and Cu films.

Static etch rate is a measurement that provides empirical data related to the chemical activity level of a CMP slurry. Typically, a higher static etch rate indicates a more aggressive chemical composition that leads to the relative fast etching of the related metal film surfaces, with a higher probability of causing more metal corrosion defects. It is very important to have efficient corrosion protection on Co film surface during and after a Co bulk CMP process. Therefore, it is essential for the Co CMP to provide low SER (static etch rate) in Co bulk CMP polishing.

Compositions disclosed herein allow polishing of barrier/liner films and the dielectric films at very high rates with low defects without needing substantially higher concentrations of abrasive particles.

CMP compositions disclosed herein comprise, consist essentially of, or consist of: water; an oxidizing agent; an abrasive comprising nano-sized particles including, but is not limited to, nano-sized colloidal silica or high purity colloidal silica particles, nano-sized inorganic metal oxide particles including silica, alumina, ceria, germania, titania, zirconia, alumina-doped silica, nano-sized diamond particles, nano-sized silicon nitride particles, mono-modal, bi-modal, or multi-modal colloidal abrasive particles, organic polymer-based soft abrasives, surface-coated or modified abrasives, and combinations thereof; an organic carboxylic acid selected from the group consisting of (1) an aliphatic organic carboxylic acid selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof; (2) an aromatic organic carboxylic acid selected from the group consisting of picolinic acid, mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof; and (2) combinations of (1) and (2); a corrosion inhibitor selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof; and, optionally, a surfactant; a pH adjusting agent, wherein the polishing composition has a pH of from about 2 to about 12, about 7 to about 11.5, or from about 9 to about 11.

Preferably, the aliphatic organic carboxylic acid is selected from the group consisting of citric acid, malonic acid, oxalic acid, lactic acid, tartaric acid, maleic acid, polyamino acetic acids, the respective salts thereof, and mixtures thereof; and the aromatic organic carboxylic acid is selected from the group consisting of picolinic acid, mandelic acid, benzoic acid, ammonium benzoate, phthalic acid, 1,2,4,5-benzenetetracarboxylic acid, 1,2,3-benzenetricarboxylic acid, phenylglycine, N-anilinoacetic acid, benzenesulfonic acid, quinaldic acid, salts thereof, and mixtures thereof Compositions disclosed herein provide removal rate improvements on all CMP pads. However, improved removal rates are especially effective on CMP pads with higher hardness. Hardness of the CMP pads is typically reported as Shore D hardness determined per ASTM D2240. CMP formulations disclosed herein are particularly well suited for CMP pads with shore hardness greater than 30, or more preferably greater than 40. Examples of such CMP pads include Visionpad™ 3500, 3100, 5000, 5200, 6000 from Dow Chemicals.

Water

The polishing compositions disclosed herein are aqueous-based and, thus, comprise water. In the compositions disclosed herein, water functions in various ways such as, for example, to dissolve one or more solid components of the composition, as a carrier of the components, as an aid in the removal of polishing residue, and as a diluent. Preferably, the water employed in the cleaning composition is deionized (DI) water.

It is believed that, for most applications, water will comprise, for example, from about 10 to about 90 wt. % (weight percent) of water. Other embodiments could comprise from about 10 to about 95 wt. %; 30 to about 90 wt. %; 30 to about 95 wt. %; 50 to about 90 wt. %; 350 to about 95 wt. % of water. Still other preferred embodiments could include water in an amount to achieve the desired weight percent of the other ingredients.

Abrasive

The polishing compositions disclosed herein comprise an abrasive. Suitable abrasives for polishing compositions are nano-sized particles include, but are not limited to, nano-sized colloidal silica or high purity colloidal silica particles; nano-sized inorganic metal oxide particles, such as alumina, titania, zirconia, ceria, and combinations thereof; nano-sized diamond particles; nano-sized silicon nitride particles; mono-modal, bi-modal, or multi-modal colloidal abrasive particles; organic polymer-based soft abrasives; surface-coated or modified abrasives; and combinations thereof.

The surface-coated or modified abrasives include but are not limited to the colloidal silica particles doped by other metal oxide within lattice of the colloidal silica, such as alumina doped silica particles, colloidal aluminum oxide, which include alpha-, beta-, and gamma-types of aluminum oxides, colloidal and photoactive titanium dioxide, cerium oxide, colloidal cerium oxide, nano-sized diamond particles, nano-sized silicon nitride particles, mono-modal, bi-modal, multi-modal colloidal abrasive particles, zirconium oxide, organic polymer-based soft abrasives, surface-coated or modified abrasives, and mixtures thereof.

The nano-sized particles have narrow or broad particle size distributions, various sizes and various shapes. The various shapes of the abrasives include spherical shape, cocoon shape, aggregate shape, and other shapes.

Preferred abrasives include, but are not limited to, high purity colloidal silica, alumina, ceria, germania, silica, titania, zirconia, alumina-doped colloidal silica in lattices, and mixtures thereof. Colloidal silica is most a preferred abrasive particle.

It is preferred that the mean particle size of the abrasive as measured by Disc Centrifuge (DC) particle sizing method is between 20 nm and 300 nm, or more preferably between 30 nm and 200 nm, and even more preferably between 40 nm and 100 nm. In some preferred embodiments, the size distribution of particles as measured by Disc Centrifuge analysis method is multi-modal. In preferred embodiments, the particle size distribution of the abrasive particles shows at least two distinct peaks in the particle size range of 30 nm to 120 nm. More preferably, there are at least three distinct peaks in the particle size range of 30 nm to 120 nm.

Typically, the abrasive is present in the compositions disclosed herein in an amount ranging from about 0.1 wt. % to about 25 wt. % relative to the total weight of the CMP composition. The preferred range is from about 0.25 wt. % to about 5 wt. % by weight.

Oxidizing Agent

The polishing compositions disclosed herein comprise an oxidizing agent, also referred to as an "oxidizer." The oxidizing agent can be any suitable oxidizing agent. Suitable oxidizing agents include, but are not limited to, one or more peroxy-compounds, which comprise at least one peroxy group (—O—O—). Suitable peroxy-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., iodates, periodates, and acids thereof, and mixtures thereof, and the like), perboric acid, perborates, percarbonates, peroxyacids (e.g., peracetic acid, perbenzoic acid, salts thereof, mixtures thereof, and the like), permanganates, cerium compounds, ferricyanides (e.g., potassium ferricyanide), mixtures thereof, and the like.

In some embodiments, preferred oxidizing agents include, but are not limited to, hydrogen peroxide, periodic acid, potassium iodate, potassium permanganate, ammonium persulfate, ammonium molybdate, ferric nitrate, nitric acid, potassium nitrate, ammonia, and mixtures thereof. In still other embodiments, preferred oxidizing agents include hydrogen peroxide and urea-hydrogen peroxide.

In some embodiments, the preferred oxidizer is hydrogen peroxide.

The amount of oxidizing agent ranges from about 0.1 wt. % to about 10 wt. % hydrogen peroxide, wherein the preferred hydrogen peroxide concentration ranges from about 0.25 wt. % to about 3 wt. %, and the most preferred hydrogen peroxide concentration ranges from about 0.4 wt. % to about 1.5 wt. %.

Aliphatic Organic Carboxylic Acid

The polishing compositions disclosed herein comprise at least one aliphatic organic carboxylic acid. The aliphatic organic carboxylic acid functions primarily as a chelating agent for the oxidized cobalt in CoO and $Co_3O_4$ that forms in the presence of the oxidizing agent, such as hydrogen peroxide.

Suitable aliphatic organic carboxylic acids include, for example, citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof. These organic acids may be used singly or in a combination of two or more types.

The amount of aliphatic organic carboxylic acid preferably ranges from 0.001 wt. % to about 1.0 wt. % relative to the total weight of the composition. The preferred range is from about 0.01 wt. % to about 0.5 wt. %. In some embodiments, the range is from about 0.4 wt. % to about 0.7 wt. %

Aromatic Organic Carboxylic Acid

The polishing compositions disclosed herein comprise at least one aromatic organic carboxylic acid. The aromatic organic carboxylic acid functions primarily as a chelating agent for the oxidized cobalt in CoO and $Co_3O_4$ that forms in the presence of the oxidizing agent, such as hydrogen peroxide.

Suitable aromatic organic carboxylic acids include, for example, Preferred examples of the aromatic organic acid include mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof. These organic acids may be used singly or in a combination of two or more types.

The amount of aromatic organic carboxylic acid preferably ranges from 0.001 wt. % to about 1.0 wt. % relative to the total weight of the composition. The preferred range is from about 0.01 wt. % to about 0.5 wt. %. In some embodiments, the range is from about 0.4 wt. % to about 0.7 wt. %.

The following components may optionally be present in the compositions disclosed herein. One of ordinary skill in the art will understand whether and under what circumstances such components may be included.

Corrosion Inhibitor

Corrosion inhibitors used in the CMP compositions disclosed herein include, but are not limited to, nitrogenous cyclic compounds such as 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof. Preferred inhibitors are 1,2,4-triazole, 1,2,3-benzotriazole, 5 amino triazole and 1,3,5-Tris(2-hydroxyethyl) isocyanurate.

The CMP compositions disclosed herein preferably contain from about 0.0005 wt. % to about 0.25 wt. % corrosion inhibitor; the preferred concentration of corrosion inhibitor ranges from about 0.0025 wt. % to about 0.15 wt. %; the most preferred concentration of corrosion inhibitor ranges from about 0.05 wt. % to about 0.1 wt. %.

Surfactant (Optional)

The compositions disclosed herein optionally comprise a surfactant, which, in part, aids in protecting the wafer surface during and after polishing to reduce defects in the wafer surface. Surfactants may also be used to control the removal rates of some of the films used in polishing such as low-K dielectrics. Suitable surfactants include non-ionic surfactants, anionic surfactants, cationic surfactants, ampholytic surfactants, and mixtures thereof.

Non-ionic surfactants may be chosen from a range of chemical types including but not limited to long chain alcohols, ethoxylated alcohols, ethoxylated acetylenic diol surfactants, polyethylene glycol alkyl ethers, proplylene glycol alkyl ethers, glucoside alkyl ethers, polyethylene glycol octylphenyl ethers, polyethylene glycol alkylpgenyl ethers, glycerol alkyl esters, polyoxyethylene glycol sorbiton alkyl esters, sorbiton alkyl esters, cocamide monoethanol amine, cocamide diethanol amine dodecyl dimethylamine oxide, block copolymers of polyethylene glycol and polypropylene glycol, polyethoxylated tallow amines, fluorosurfactants. The molecular weight of surfactants may range from several hundreds to over 1 million. The viscosities of these materials also possess a very broad distribution.

Anionic surfactants include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, and substituted aryl biphosphate etc. The counter ions for this type of surfactants include, but are not limited to potassium, ammonium, and other positive ions. The molecular weights of these anionic surface wetting agents range from several hundred to several hundred-thousand.

Cationic surfactants possess the positive net charge on major part of molecular frame. Cationic surfactants are typically halides of molecules comprising hydrophobic chain and cationic charge centers such as amines, quaternary ammonium, benzyalkonium, and alkylpyridinium ions.

In another aspect, the surfactant can be an ampholytic surfactant, which possess both positive (cationic) and negative (anionic) charges on the main molecular chains and with their relative counter ions. The cationic part is based on primary, secondary, or tertiary amines or quaternary ammonium cations. The anionic part can be more variable and include sulfonates, as in the sultaines CHAPS (3-[(3-Cholamidopropyl)dimethylammonio]-1-propanesulfonate) and cocamidopropyl hydroxysultaine. Betaines such as cocamidopropyl betaine have a carboxylate with the ammonium. Some of the ampholytic surfactants may have a phosphate anion with an amine or ammonium, such as the phospholipids phosphatidylserine, phosphatidylethanolamine, phosphatidylcholine, and sphingomyelins.

Examples of surfactants also include, but are not limited to, dodecyl sulfate sodium salt, sodium lauryl sulfate, dodecyl sulfate ammonium salt, secondary alkane sulfonates, alcohol ethoxylate, acetylenic surfactant, and any combination thereof. Examples of suitable commercially available surfactants include TRITON™, Tergitol™, DOWFAX™ family of surfactants manufactured by Dow Chemicals and various surfactants in SURFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals.

When employed, the amount of surfactant typically ranges from 0.0001 wt. % to about 1.0 wt. % relative to the total weight of the barrier CMP composition. When employed, the preferred range is from about 0.010 wt. % to about 0.1 wt. %.

pH Adjusting Agent (Optional)

Compositions disclosed herein comprise pH adjusting agents. A pH adjusting agent is typically employed in the compositions disclosed herein to raise or lower the pH of the polishing composition. The pH-adjusting agent may be used to improve the stability of the polishing composition, to tune the ionic strength of the polishing composition, and to improve the safety in handling and use, as needed.

Suitable pH-adjusting agents to lower the pH of the polishing composition include, but are not limited to, nitric acid, sulfuric acid, tartaric acid, succinic acid, citric acid, malic acid, malonic acid, various fatty acids, various polycarboxylic acids and mixtures thereof. Suitable pH-adjusting agents to raise the pH of the polishing composition include, but are not limited to, potassium hydroxide, sodium hydroxide, ammonia, tetraethylammonium hydroxide, ethylenediamine, piperazine, polyethyleneimine, modified polyethyleneimine, and mixtures thereof.

When employed, the amount of pH-adjusting agent preferably ranges from about 0.01 wt. % to about 5.0 wt. % relative to the total weight of the polishing composition. The preferred range is from about 0.01 wt. % to about 1 wt. % or from about 0.05 wt. % to about 0.15 wt. %.

pH of the compositions disclosed herein ranges from about 2 to about 12, about 7 to about 11.5, or from about 9 to about 11.

Chelating Agent (Optional)

Chelating agents may optionally be employed in the compositions disclosed herein to enhance affinity of chelating ligands for metal cations. Chelating agents may also be used to prevent build-up of metal ions on pads which causes pad staining and instability in removal rates. Suitable chelating agents include, but are not limited to, for example, amine compounds such as ethylene diamine, amino poly-carboxylic acids such as ethylene diamine tetraacetic acid (EDTA), nitrilotriacetic acid (NTA); aromatic acids or salts thereof; various amino acids and their derivatives such as Glycine, Serine, Proline, Histidine, Isoleucine, Leucine, Lysine, Methionine, Phenylalanine, Threonine, Tryptophan, Valine, Arginine, Asparagine, Aspartic acid, cystein, Glutamic acid, Glutamine, Ornithine, Selenocystein, Tyrosine, Sarcosine, Bicine, Tricine, Aceglutamide, N-Acetylaspartic acid, Acetylcarnitine, Acetylcysteine, N-Acetylglutamic acid, Acetylleucine, Acivicin, S-Adenosyl-L-homocysteine, Agaritine, Alanosine, Aminohippuric acid, L-Arginine ethyl ester, Aspartame, Aspartylglucosamine, Benzylmercapturic acid, Biocytin, Brivanib alaninate, Carbocisteine, N (6)-Carboxymethyllysine, Carglumic acid, Cilastatin, Citiolone, Coprine, Dibromotyrosine, Dihydroxyphenylglycine, Eflornithine, Fenclonine, 4-Fluoro-L-threonine, N-Formylmethionine, Gamma-L-Glutamyl-L-cysteine, 4-(γ-Glutamylamino) butanoic acid, Glutaurine, Glycocyamine, Hadacidin, Hepapressin, Lisinopril, Lymecycline, N-Methyl-D-aspartic acid, N-Methyl-L-glutamic acid, Milacemide, Nitrosoproline, Nocardicin A, Nopaline, Octopine, Ombrabulin, Opine, Orthanilic acid, Oxaceprol, Polylysine, Remacemide, Salicyluric acid, Silk amino acid, Stampidine, Tabtoxin, Tetrazolylglycine, Thiorphan, Thymectacin, Tiopronin, Tryptophan tryptophylquinone, Valaciclovir, Valganciclovir, and phosphonic acid and its derivatives such as, for example, octylphosphonic acid, aminobenzylphosphonic acid, and combinations thereof and salts thereof.

Chelating agents may be employed where there is a need to chemically bond, for example, copper cations and tantalum cations to accelerate the dissolution of copper oxide and tantalum oxide to yield the desirable removal rates of copper lines, vias, or trenches and barrier layer, or barrier films.

When employed, the amount of chelating agent preferably ranges from about 0.01 wt. % to about 3.0 wt. % relative to the total weight of the composition and, more preferably, from about 0.4 wt. % to about 1.5 wt. %.

Biocide (Optional)

CMP formulations disclosed herein may also comprise additives to control biological growth such as biocides. Some of the additives to control biological growth are disclosed in U.S. Pat. No. 5,230,833 and U.S. patent application Publication No. 2002/0025762, which is incorporated herein by reference. Biological growth inhibitors include but are not limited to tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, sodium hypochlorite, isothiazolinone compounds such as methylisothiazolinone, methylchloroisothiazolinone and benzisothiazolinone. Some of the commercially available preservatives include KATHON™ and NEOLENE™ product families from Dow Chemicals and Preventol™ family from Lanxess.

The preferred biocides are isothiozilone compounds such as methylisothiazolinone, methylchloroisothiazolinone and benzisothiazolinone The CMP polishing compositions optionally contain a biocide ranging from 0.0001 wt. % to 0.10 wt. %, preferably from 0.0001 wt. % to 0.005 wt. %, and more preferably from 0.0002 wt. % to 0.0025 wt. % to prevent bacterial and fungal growth during storage.

Compositions disclosed herein may be manufactured in a concentrated form and subsequently diluted at the point of use with DI water. Other components such as, for example, the oxidizer, may be withheld in the concentrate form and added at the point of use to minimize incompatibilities between components in the concentrate form. The compositions disclosed herein may be manufactured in two or more components which can be mixed prior to use.

When used for barrier CMP, these compositions can be used for the step of the process where the barrier and the dielectric films are polished at higher rates compared to the metal lines. In some embodiments, the barrier chemical mechanical polishing composition is effective for use in the second stage of chemical mechanical polishing of the patterned wafers and provides at least one of the following: affords a desirable removal rates of various types of film, affords a desirable low level of within a wafer non-uniformity ("WIW NU %"), results in low residue level(s) being present on the polished wafer(s) subsequent to CMP processing, and affords desirable selectivity among various films.

Compositions disclosed herein demonstrate reduced Co film static etch rates (SER) for better Co film corrosion protection; minimized or eliminated the possible galvanic corrosion at Co/Cu interface by tuning open circuit potentials of Co and Co films; low barrier film and dielectric film removal rates; high and desirable removal selectivity of cobalt vs. dielectric films such as TEOS, SiNx, low-k, and ultra-low-k films, and cobalt vs. barrier films such as Ta, TaN, Ti, and TiN films.

In preferred embodiments, the removal rates of cobalt films at 3 psi down-force and 135 RPM table speed are more than 350 Å/min.

A polishing composition disclosed herein may be prepared by a common process for preparing an aqueous polishing slurry composition. Specifically, to an aqueous solvent/carrier are added a proper amount of polishing grain (polishing material particles) and, if necessary, a proper amount of a dispersing agent. In such a state, the grains are aggregated. Thus, the aggregated polishing material particles are dispersed into particles with a desired particle size by conducting dispersion of the polishing grain mixture. In such a dispersion process, an appropriate apparatus may be used, including an ultrasonic disperser, a bead mill, a kneader, and a ball mill. A thickener may be added before or after the dispersion process.

A typical CMP process employing a polishing composition disclosed herein may be conducted, using, for example a procedure described below. First, a substrate is prepared, on which an insulating film is formed, a concave with a given pattern is formed on the insulating film and a cobalt metal or cobalt alloy film is deposited on the concave. The substrate is placed on a wafer carrier such as a spindle. The metal film surface of the substrate is contacted with a polishing pad attached on a surface plate such as a rotary plate, under a given pressure. While supplying a polishing slurry between the substrate and the polishing pad, polishing is initiated by relatively moving the substrate (wafer) and the polishing pad (e.g., rotating both). The polishing slurry may be supplied on the polishing pad from a separate supply pipe or from the surface plate side. If necessary, a pad conditioner is contacted with the surface of the polishing pad to condition the surface of the polishing pad.

Thus, in another embodiment, disclosed herein is a method for selective chemical mechanical polishing comprising: a) providing a semiconductor substrate having a surface containing a first material and at least one second material; wherein the first material is Co and the second material is at least one selected from the group consisting of dielectric film, low-k and ultra-low-k film, and barrier film; b) providing a polishing pad; c) providing a chemical mechanical polishing composition comprising: water; an oxidizing agent; an abrasive comprising nano-sized particles selected from the group consisting of silica, alumina, ceria, germania, titania, zirconia, alumina-doped silica, and mixtures thereof; an organic carboxylic acid selected from the group consisting of (1) an aliphatic organic carboxylic acid selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof; (2) an aromatic organic carboxylic acid selected from the group consisting of picolinic acid, mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof; and (2) combinations of (1) and (2); a corrosion inhibitor selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof; and, optionally, a surfactant; a pH adjusting agent, wherein the polishing composition has a pH of from about 2 to about 12, about 7 to about 11.5, or from about 9 to about 11; and d) polishing the surface of the semiconductor substrate to selectively remove the first material, wherein Co is a metal inter-connection material, at least a portion of the surface is in contact with both the polishing pad and the chemical mechanical polishing composition, and ratio of removal rate of the first material to removal rate of the second material is greater than 1.

In yet another embodiment, disclosed herein is a method for chemical mechanical planarization of a semiconductor device comprising at least one surface comprising cobalt or a cobalt alloy, the method comprising the steps of: a. contacting the at least one surface comprising cobalt or a cobalt alloy with a polishing pad; b. delivering to the at least one surface comprising cobalt or a cobalt alloy a polishing composition comprising: water; an oxidizing agent; an abrasive comprising nano-sized particles selected from the group consisting of silica, alumina, ceria, germania, titania, zirconia, alumina-doped silica, and mixtures thereof; an organic carboxylic acid selected from the group consisting of (1) an aliphatic organic carboxylic acid selected from the group consisting of citric acid, malonic acid, oxalic acid, succinic acid, lactic acid, tartaric acid, adipic acid, pimelic acid, suberic acid, azelaic acid, sebacic acid, maleic acid, fumaric acid, polyamino acetic acids, polyamino propionic acids, the respective salts thereof, and mixtures thereof; (2) an aromatic organic carboxylic acid selected from the group consisting of picolinic acid, mandelic acid, toluene-2,α-dicarboxylic acid, benzoic acid, ammonium benzoate, n-amyl benzoate, vinyl benzoate, methyl benzoate, ethyl benzoate, benzoic acid anhydride, phthalic acid, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof; and (2) combinations of (1) and (2); a corrosion inhibitor selected from the group consisting of 1,2,3-triazole, 1,2,4-triazole, 1,2,3-benzotriazole, 5-methylbenzotriazole, benzotriazole, 1-hydroxybenzotriazole, 4-hydroxybenzotriazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof; and, optionally, a surfactant; a pH adjusting agent, wherein the polishing composition has a pH of from about 2 to about 12, about 7 to about 11.5, or from about 9 to about 11; and c. polishing the at least one surface comprising cobalt or a cobalt alloy with the polishing composition to at least partially remove the at least one surface comprising cobalt or a cobalt alloy.

A polishing composition described above may be most effectively used when polishing by CMP is conducted to a substrate in which a barrier or liner metal film is deposited on an insulating film comprising a concave such as a trench and a connection hole and a conductive metal film is formed over the whole surface while filling the concave with the metal, to form an electric connection such as a damascene interconnect, a via plug and a contact plug. Examples of an insulating film include a silicon oxide film, a BPSG film and an SOG film. Examples of a conductive metal film include those made of copper, silver, gold, platinum, titanium, tungsten, aluminum, ruthenium, and alloys thereof. Examples of a barrier metal film include those made of a cobalt or cobalt alloy, tantalum-based metal film such as tantalum (Ta), tantalum nitride and tantalum nitride silicon; a titanium-based metal such as titanium (Ti) and titanium nitride; a tungsten-based metal such as tungsten (W), tungsten nitride and tungsten nitride silicon.

Thus, the present disclosure also provides a system for chemical mechanical planarization, comprising: a semiconductor device comprising at least one surface, wherein the at least one surface has (1) a barrier layer comprising cobalt or cobalt alloy; (2) an interconnect metal layer selected from the group of copper, tungsten, cobalt, aluminum, or their alloys; and (3) a porous or non-porous dielectric layer; a polishing pad; and a polishing composition as described herein, wherein the at least one surface is in contact with the polishing pad and the polishing composition. The polishing compositions and methods described herein will be illustrated in more detail with reference to the following examples, but it should be understood that it is not deemed to be limited thereto.

WORKING EXAMPLES

General Experimental Procedure

All percentages are weight percentages unless otherwise indicated. In the examples presented below, CMP experiments were run using the procedures and experimental conditions given below.

The polishing composition and associated methods described herein are effective for CMP of a wide variety of substrates, including most of substrates having, particularly useful for polishing cobalt substrates.

Polishing Pad: Polishing pad, Fujibo Pad were used during CMP, supplied by Fujibo Echime Co., Ltd.
PARAMETERS:
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
TEOS: silicon oxide films by Chemical Vapor Deposition (CVD) using tetraethylk orthosilicate as the precursor
Removal Rates and Selectivity Removal Rate(RR)=(film thickness before polishing–film thickness after polishing)/polish time.

Co RR 3.0 psi Measured tungsten removal rate at 3.0 psi down pressure of the CMP tool
Cu RR 3.0 psi Measured TEOS removal rate at 3.0 psi down pressure of the CMP tool General Experimental Procedure All percentages are weight percentages unless otherwise indicated.

In the examples presented below, CMP experiments were run using the procedures and experimental conditions given below. The CMP tool that was used in the examples is a Mirra®, manufactured by Applied Materials, 3050 Boweres Avenue, Santa Clara, California, 95054. A Fujibo pad, supplied by Fujibo Echime Co., Ltd., was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Planarization Platform of Air Products Chemicals Inc. at baseline conditions. Polishing experiments were conducted using blanket W wafer with 8K Angstroms in thickness, and TEOS wafer. These blanket wafers were purchased from Silicon Valley Microelectronics, 1150 Campbell Ave, CA, 95126.

The associated methods described herein entailed use of the compositions disclosed herein for chemical mechanical planarization of substrates comprised of cobalt or cobalt alloy. In the methods, a substrate (e.g., a wafer with Co surface or Co plug) was placed face-down on a polishing pad which was fixedly attached to a rotatable platen of a CMP polisher. In this manner, the substrate to be polished and planarized was placed in direct contact with the polishing pad. A wafer carrier system or polishing head was used to hold the substrate in place and to apply a downward pressure against the backside of the substrate during CMP processing while the platen and the substrate were rotated. The polishing composition (slurry) was applied (usually continuously) on the pad during CMP processing for effective removal of material and planarizing the substrate.

Static etch rate is a measurement that provides empirical data related to the chemical activity level of a CMP slurry. Typically, a higher static etch rate is indicative of a more aggressive chemical composition that leads to the relative fast etching of the related metal film surfaces, with a higher probability of causing more metal corrosion defects. Chips cut from a cobalt blanket wafer were exposed to the Co barrier film polishing formulations disclosed herein.

Example 1

In Example 1, the CMP compositions contained the following: 0.5266 wt. % potassium hydroxide, 0.0105 wt. % 1,2,3-benzotriazole(BTA), 1.035 wt. % high purity colloidal silica, 1.0% $H_2O_2$ was used as the oxidizing agent, and 0.00775 wt. % Dynol® 607 surfactant (ethoxylated-2,5,8,11-tetramethyl-6-dodecyn-5,8-dio from Evonik Inc.), 0.5 wt. % (as 1× concentration) of different organic acids, and DI water. pH of the composition was about 10.0.

The polish test results of using some invented Co barrier CMP polishing compositions to polish Co and Cu films are listed in Table 1.

TABLE 1

The Effects of Additives on Co and Cu Removal Rates

| Sample | Co RR (Å/min.) | Cu RR (Å/min.) |
|---|---|---|
| 1× Lactic Acid | 511 | 203 |
| 1× Malic Acid | 387 | 147 |
| 1× mandelic Acid | 379 | 74 |
| 1× Oxalic Acid | 609 | 256 |
| 1× Malonic Acid | 666 | 208 |
| 1× Citric Acid | 448 | 116 |

As data shown in Table 1, Co film removal rates were high enough for Co barrier CMP applications in general. The formulation with 1× malonic acid gave the highest Co film removal rate. The copper film removal rates were tuned with the use of different organic acids.

In order to provide better Co film surface corrosion protection during and after a Co barrier CMP process, it is important for Co barrier CMP polish compositions to have low static etch rate (SER) on Co film surfaces.

All measurements were conducted at room temperature and using Co films deposited by PVD.

Table 2 listed the static etch rate measurement results.

TABLE 2

Static Etch Rates on PVD Co Films

| Sample | Co RR (Å/min.) | Co SER (Å/min.) |
|---|---|---|
| 1× Lactic Acid | 511 | 0.1 |
| 1× Malic Acid | 387 | 1.3 |
| 1× Oxalic Acid | 609 | 7.4 |
| 1× Malonic Acid | 666 | 0.1 |
| 1× Citric Acid | 448 | 1.9 |

As the data showed in Table 2, the invented Co barrier CMP polishing compositions herein meet the needs of providing desirable Co film removal rates, while at same time, achieving very low static etch rates on Co film surface for better Co film surface corrosion protection.

The formulation with 1× malonic acid gave the highest Co film removal rate and lowest static etch rate.

The open circuit potentials of Co and Cu films measuring the potential galvanic corrosion at the Co/Cu interface was performed.

The result has shown that the Co barrier polishing composition (using 1× lactic acid) gave tunable open circuit potentials of Co film. The open circuit potential of Co film was almost the same as that for Cu film (around 280 mV) which helps to minimize or even eliminate the possible galvanic corrosion reactions at Co/Cu interface.

Example 2

As the key requirements for Co Barrier CMP applications, Co barrier polishing compositions not only need to polish Co and Cu films, but also need to polishing other types of films to meet the needs of Co barrier CMP applications. These other types of films included, but not limited to, dielectric films, such as TEOS or low-k (LK) films, and barrier films, such as TaN film.

The polishing compositions listed in Example 1 were used to polish TEOS, LK, and TaN films. The polishing results were listed in Table 3.

TABLE 3

The Effects of Additives on Film Removal Rates

| Sample | Co RR (Å/min.) | Cu RR (Å/min.) | TaN RR (Å/min.) | TEOS RR (Å/min.) | BD1 RR (Å/min.) |
|---|---|---|---|---|---|
| 1× Lactic Acid | 511 | 203 | 346 | 134 | 65 |
| 1× Malic Acid | 387 | 147 | 203 | 50 | 44 |
| 1× mandelic Acid | 379 | 74 | 327 | 50 | 49 |
| 1× Oxalic Acid | 609 | 256 | 315 | 66 | 61 |
| 1× Malonic Acid | 666 | 208 | 249 | 25 | 54 |
| 1× Citric Acid | 448 | 116 | 126 | 12 | 51 |

As the results shown in Table 3, the different organic acids having the same wt. % in Co barrier polishing compositions provided quite different barrier and dielectric film removal rates.

The results provided the good options to tune the selectivity of Co:Cu, Co:TaN; Co:TEOS, and Co:Low-K(BD1) Co barrier CMP applications. For example, for the low selectivity of Co:TaN, mandelic acid is the preferred organic acid. For the high selectivity of Co:TaN, malonic acid or citric acid is the preferred organic acid.

Example 3

In Example 3, the CMP compositions contained the following: 0.5266 wt. % or 0.7021 wt. % potassium hydroxide (KOH), 0.0105 wt. % BTA, 1.035 wt. % high purity colloidal silica, 1.0% $H_2O_2$, 0.5 wt. % lactic acid, 0.00775 wt. % Dynol® 607 surfactant, and DI water. pH of the composition was adjusted to about 10.0.

The effects of conductivity in samples by using different wt. % potassium hydroxide on film removal rates were examined. The test results were listed in Table 4.

As the results shown in Table 4, increasing KOH concentration from 0.5266 wt. % to 0.7021 wt. % suppressed all types of film removal rates.

TABLE 4

The Effects of KOH Concentrations on Film Removal Rates

| Sample | Co RR (Å/min.) | Cu RR (Å/min.) | TaN RR (Å/min.) | TEOS RR (Å/min.) | BD1 RR (Å/min.) |
|---|---|---|---|---|---|
| Lactic Acid, 0.5266 wt. % | 511 | 203 | 346 | 134 | 65 |
| Lactic Acid, 0.7032 wt. % | 375 | 120 | 314 | 67 | 53 |

The results indicated that KOH concentrations can be used as a tuning factor in suppressing film removal rate, and tune the film selectivity in Co barrier CMP applications.

Example 4

In Example 4, the CMP compositions contained the following: 0.5 wt. % lactic acid (as 1× concentration), 0.7021 wt. % potassium hydroxide, 0.0105 wt. % BTA, 1.035 wt. % high purity colloidal silica, 1.0% $H_2O_2$, and 0.00775 wt. % Dynol® 607 surfactant, and DI water. pH of the composition was about 10.0.

The effects of pH in samples on film removal rates were examined. The test results were listed in Table 5.

As the results shown in Table 5, increasing pH from 10 suppressed Co, and Cu film removal rates; boosted TaN film removal rates, and had no significant changes for TEOS and BD1 film removal rates. The results indicated that pH condition adjustments can be used as a tuning factor in suppressing some film removal rate, and boosting other film removal rates, and maintain some types of film removal rates, thus, achieve the desired film selectivity tuning in Co barrier CMP applications.

TABLE 5

The Effects of pH on Film Removal Rates

| Sample | Co RR (Å/min.) | Cu RR (Å/min.) | TaN RR (Å/min.) | TEOS RR (Å/min.) | BD1 RR (Å/min.) |
|---|---|---|---|---|---|
| pH 10 | 375 | 120 | 314 | 67 | 53 |
| pH 11 | 316 | 93 | 341 | 65 | 51 |

Example 5

In Example 5, the CMP compositions contained the following: 0.5 wt. % lactic acid (as 1× concentration), 0.7021 wt. % potassium hydroxide, 0.0105 wt. % BTA, 1.035 wt. % high purity colloidal silica, 0.5 wt. % or 1.0 wt. % $H_2O_2$, and 0.00775 wt. % Dynol® 607 surfactant, and DI water. pH of the composition was about 10.0.

The test results were listed in Table 6.

TABLE 6

The Effects of H2O2 wt. % on Film Removal Rates

| Sample | Co RR (Å/min.) | Cu RR (Å/min.) | TaN RR (Å/min.) | TEOS RR (Å/min.) | BD1 RR (Å/min.) |
|---|---|---|---|---|---|
| 1.0 wt. % $H_2O_2$ | 375 | 120 | 314 | 67 | 53 |
| 0.5 wt. % $H_2O_2$ | 415 | 199 | 268 | 68 | 43 |

As the results shown in Table 6, reducing $H_2O_2$ from 1.0 wt. % to 0.5 wt. % boosted Co, and Cu film removal rates and suppressed TaN film removal rates, and have no significant effects on TEOS and BD1 film removal rates. Thus, $H_2O_2$ concentrations can be used as a tuning factor in suppressing some film removal rate, and boosting other film removal rates, maintaining some types of film removal rates, thus, and tuning the desired film selectivity in Co barrier CMP applications.

Example 6

In Example 6, the CMP compositions contained the following: 0.5 wt. % lactic acid, 0.7021 wt. % potassium hydroxide, 0.0105 wt. % BTA, 1.035 wt. % high purity colloidal silica (1× HPCS) or 2.070 wt. % high purity colloidal silica (2×HPCS), 1.0% $H_2O_2$, 0.00775 wt. % Dynol® 607 surfactant, and DI water. pH adjusting agent was used to bring the pH to 10.0 for the tested samples.

The effects of abrasive concentrations in samples on film removal rates were examined. The test results were listed in Table 7.

TABLE 7

The Effects of HPCS wt. % on Film Removal Rates

| Sample | Co RR (Å/min.) | Cu RR (Å/min.) | TaN RR (Å/min.) | TEOS RR (Å/min.) | BD1 RR (Å/min.) |
|---|---|---|---|---|---|
| 1× HPCS | 375 | 120 | 314 | 67 | 53 |
| 2× HPCS | 437 | 383 | 311 | 154 | 99 |

As the results shown in Table 7, increasing high purity colloidal silica abrasive concentration from 1× to 2× boosted Co, Cu, TEOS, and BD1 film removal rates and provided similar TaN film removal rate., The concentrations of the abrasive used in the Co barrier slurries can be used as a tuning factor in boosting or reducing most film removal rates, and maintaining some types of film removal rates, thus, tuning the desired film selectivity in Co barrier CMP applications.

Example 7

In Example 7, the CMP compositions contained the following: 0.5 wt. % of an aliphatic organic carboxylic acid (lactic acid) or aromatic organic carboxylic acid (picolinic acid), 0.7021 wt. % potassium hydroxide, 0.0105 wt. % BTA, 1.035 wt. % high purity colloidal silica, 1.0% $H_2O_2$, 0.00775 wt. % Dynol® 607 surfactant, and DI water. pH adjusting agent was used to bring the pH to 10.0 for the tested samples.

The test results were listed in Table 8.

TABLE 8

The Effects of aliphatic organic carboxylic acid vs aromatic organic carboxylic acid on film removal rates

| Sample | Co RR (Å/min.) | Cu RR (Å/min.) | TaN RR (Å/min.) | TEOS RR (Å/min.) | BD1 RR (Å/min.) |
|---|---|---|---|---|---|
| Lactic Acid | 375 | 120 | 314 | 67 | 53 |
| Picolinic Acid | 455 | 69 | 338 | 63 | 55 |

As the results shown in Table 8, polishing compositions having picolinic acid, comparing with having lactic acid, provided higher Co and TaN film removal rates, significantly suppressed Cu film removal rate, and provided similar TEOS and BD1 film removal rate. The results indicated that types of the organic acids (an aliphatic organic carboxylic acid or aromatic organic carboxylic acid) can be used as a tuning factor in boosting or reducing some film removal rates, and maintain other types of film removal rates, thus, tuning the desired film selectivity in Co barrier CMP applications.

The forgoing working examples had demonstrated that compositions disclosed herein provide desirable high and tunable Co film removal rates.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A chemical mechanical planarization composition comprising:
   water;
   an oxidizing agent selected from the group consisting of hydrogen peroxide, periodic acid, potassium iodate, potassium permanganate, ammonium persulfate, ammonium molybdate, ferric nitrate, nitric acid, potassium nitrate, ammonia, and mixtures thereof;
   an abrasive comprising nano-sized particles selected from the group consisting of silica, alumina, ceria, germania, titania, zirconia, alumina-doped silica, and mixtures thereof;
   an aromatic organic carboxylic acid selected from the group consisting of toluene-2,α-dicarboxylic acid, ammonium benzoate, n-amyl benzoate, vinyl benzoate, methyl benzoate, ethyl benzoate, benzoic acid anhydride, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof;
   a corrosion inhibitor selected from the group consisting of 1,2,3-triazole, 1,2,4-triazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof;
   a surfactant selected from the group consisting of an anionic surfactant, a cationic surfactant, an ampholytic surfactant, and mixtures thereof;
   and, optionally,
   a pH adjusting agent,
   wherein the polishing composition has a pH of from 9 to 11.

2. The chemical mechanical planarization composition of claim 1, wherein the abrasive is present in an amount of from 0.25 wt. % to 5.0 wt. %; the oxidizing agent is present in an amount of from 0.25 wt. % to 3 wt. %; the aromatic organic carboxylic acid is present at from 0.4 wt. % to 1.4 wt. %; and the corrosion inhibitor is present in an amount of from 0.0025 wt. % to about 0.15 wt. %.

3. The chemical mechanical planarization composition of claim 1, wherein the aromatic organic carboxylic acid is selected from the group consisting of ammonium benzoate, 1,2,4,5-benzenetetracarboxylic acid, 1,2,3-benzenetricarboxylic acid, phenylglycine, N-anilinoacetic acid, quinaldic acid, salts thereof, and mixtures thereof; and the oxidizing agent is selected from the group consisting of hydrogen peroxide and urea-hydrogen peroxide.

4. The chemical mechanical planarization composition of claim 1, wherein the abrasive is selected from the group consisting of silica, alumina, and ceria, and combinations thereof; the abrasive is colloid silica, and combinations thereof; the oxidizing agent is selected from the group consisting of hydrogen peroxide and urea-hydrogen peroxide; and the corrosion inhibitor is selected from the group consisting of 1,2,4-triazole, 5 amino triazole and 1,3,5-Tris (2-hydroxyethyl) isocyanurate.

5. The chemical mechanical planarization composition of claim 1, wherein the abrasive is silica; the oxidizing agent hydrogen peroxide; and pH of the composition is from 9 to 11.

6. The chemical mechanical planarization composition of claim 1 wherein the pH adjusting agent is present and is selected from the group consisting of nitric acid, sulfuric acid, potassium hydroxide, sodium hydroxide, ammonia, tetraethylammonium hydroxide, ethylenediamine, piperazine, polyethyleneimine, and mixtures thereof.

7. A method of a selective chemical mechanical polishing comprising:
   a) providing a semiconductor substrate having a surface containing a first material and at least one second material; wherein the first material is Co and the second material is at least one selected from the group consisting of dielectric film selected from the group consisting of TEOS film, SiNx film with x ranging 1.0<x<1.5, and combinations thereof, low-k and ultra-low k film, and barrier film selected from the group consisting of Ta film, TaN film, Ti film, TiN film and combinations thereof;
   b) providing a polishing pad;
   c) providing a chemical mechanical polishing composition comprising:
   water;
      an oxidizing agent selected from the group consisting of hydrogen peroxide, periodic acid, potassium iodate, potassium permanganate, ammonium persulfate, ammonium molybdate, ferric nitrate, nitric acid, potassium nitrate, ammonia, and mixtures thereof;
      an abrasive comprising nano-sized particles selected from the group consisting of silica, alumina, ceria, germania, titania, zirconia, alumina-doped silica, and mixtures thereof;
      an aromatic organic carboxylic acid selected from the group consisting of toluene-2,α-dicarboxylic acid, ammonium benzoate, n-amyl benzoate, vinyl benzoate, methyl benzoate, ethyl benzoate, benzoic acid anhydride, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof;
      a corrosion inhibitor selected from the group consisting of 1,2,3-triazole, 1,2,4-triazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof;
      a surfactant selected from the group consisting of an anionic surfactant, a cationic surfactant, an ampholytic surfactant, and mixtures thereof;
      and, optionally,
         a pH adjusting agent,
      wherein the polishing composition has a pH of from 9 to 11; and
   d) polishing the surface of the semiconductor substrate to selectively remove the first material, wherein Co is a metal inter-connection material, at least a portion of the surface is in contact with both the polishing pad and the chemical mechanical polishing composition, and ratio of removal rate of the first material to removal rate of the second material is greater than 1.

8. The method of claim 7, wherein the abrasive is present in an amount of from 0.25 wt. % to 5.0 wt. %; the oxidizing agent is present in an amount of from 0.25 wt. % to 3 wt. %; the aromatic organic carboxylic acid is present at from 0.4 wt. % to 1.4 wt. %; and the corrosion inhibitor is present in an amount of from 0.0025 wt. % to about 0.15 wt. %; in the chemical mechanical planarization composition.

9. The method of claim 7, wherein aromatic organic carboxylic acid is selected from the group consisting of ammonium benzoate, 1,2,4,5-benzenetetracarboxylic acid, 1,2,3-benzenetricarboxylic acid, phenylglycine, N-anilinoacetic acid, quinaldic acid, salts thereof, and mixtures thereof; and the oxidizing agent is selected from the group consisting of hydrogen peroxide and urea-hydrogen peroxide.

10. The method of claim 7, wherein the pH adjusting agent is present in the chemical mechanical planarization composition and is selected from the group consisting of nitric acid, sulfuric acid, potassium hydroxide, sodium hydroxide, ammonia, tetraethylammonium hydroxide, ethylenediamine, piperazine, polyethyleneimine, and mixtures thereof.

11. The method of claim 7, wherein the abrasive is selected from the group consisting of silica, alumina, and ceria, and combinations thereof; the abrasive is colloid silica; the oxidizing agent is selected from the group consisting of hydrogen peroxide and urea-hydrogen peroxide; and the corrosion inhibitor is selected from the group consisting of 1,2,4-triazole, 5 amino triazole and 1,3,5-Tris (2-hydroxyethyl) isocyanurate.

12. The method of claim 7, wherein the abrasive is silica, the aromatic organic carboxylic acid is picolinic acid; the oxidizing agent hydrogen peroxide; and pH of the chemical mechanical planarization composition is from 9 to 11.

13. A system for a selective chemical mechanical polishing comprising:
   a) providing a semiconductor substrate having a surface containing a first material and at least one second material; wherein the first material is Co and the second material is at least one selected from the group consisting of dielectric film selected from the group consisting of TEOS film, SiNx film with x ranging 1.0<x<1.5, and combinations thereof, low-k and ultra-low k film, and barrier film selected from the group consisting of Ta film, TaN film, Ti film, TiN film and combinations thereof;
   b) providing a polishing pad;
   c) providing a chemical mechanical polishing composition comprising:
   water;
      an oxidizing agent selected from the group consisting of hydrogen peroxide, periodic acid, potassium iodate, potassium permanganate, ammonium persulfate, ammonium molybdate, ferric nitrate, nitric acid, potassium nitrate, ammonia, and mixtures thereof;

an abrasive comprising nano-sized particles selected from the group consisting of silica, alumina, ceria, germania, titania, zirconia, alumina-doped silica, and mixtures thereof;

an aromatic organic carboxylic acid selected from the group consisting of toluene-2,α-dicarboxylic acid, ammonium benzoate, n-amyl benzoate, vinyl benzoate, methyl benzoate, ethyl benzoate, benzoic acid anhydride, methyl phthalate, methyl isophthalate, methyl terephthalate, 1,2,4,5-benzenetetracarboxylic acid, 1,2,3-benzenetricarboxylic acid, phenylglycine, N-anilinoacetic acid, sodium o-hydroxybenzoate (sodium salicylate), potassium o-hydroxybenzoate, anthranilic acid, benzylmercapturic acid, aminotoluic acid, quinaldic acid, salts thereof, and mixtures thereof;

a corrosion inhibitor selected from the group consisting of 1,2,3-triazole, 1,2,4-triazole, 3-amino-1,2,4-triazole, 4-amino-4H-1,2,4-triazole, 5 amino triazole, benzimidazole, benzothiazoles such as 2,1,3-benzothiadiazole, triazinethiol, triazinedithiol, and triazinetrithiol, pyrazoles, imidazoles, isocyanurate such as 1,3,5-Tris(2-hydroxyethyl), and mixtures thereof;

a surfactant selected from the group consisting of an anionic surfactant, a cationic surfactant, an ampholytic surfactant, and mixtures thereof;

and, optionally, a pH adjusting agent, wherein the polishing composition has a pH of from 9 to 11; and d) polishing the surface of the semiconductor substrate to selectively remove the first material, wherein Co is a metal inter-connection material, at least a portion of the surface is in contact with both the polishing pad and the chemical mechanical polishing composition, and ratio of removal rate of the first material to removal rate of the second material is greater than 1.

14. The system of claim 13, wherein the abrasive is present in an amount of from 0.25 wt. % to 5.0 wt. %; the oxidizing agent is present in an amount of from 0.25 wt. % to 3 wt. %; the aromatic organic carboxylic acid is present at from 0.4 wt. % to 1.4 wt. %; and the corrosion inhibitor is present in an amount of from 0.0025 wt. % to about 0.15 wt. %; in the chemical mechanical planarization composition.

15. The system of claim 13, wherein the aromatic organic carboxylic acid is selected from the group consisting of ammonium benzoate, 1,2,4,5-benzenetetracarboxylic acid, 1,2,3-benzenetricarboxylic acid, phenylglycine, N-anilinoacetic acid, quinaldic acid, salts thereof, and mixtures thereof; and the oxidizing agent is selected from the group consisting of hydrogen peroxide and urea-hydrogen peroxide.

16. The system of claim 13, wherein the pH adjusting agent is present in the chemical mechanical planarization composition and is selected from the group consisting of nitric acid, sulfuric acid, potassium hydroxide, sodium hydroxide, ammonia, tetraethylammonium hydroxide, ethylenediamine, piperazine, polyethyleneimine, and mixtures thereof.

17. The system of claim 13, wherein the abrasive is selected from the group consisting of silica, alumina, and ceria, and combinations thereof; the abrasive is colloid silica; the oxidizing agent is selected from the group consisting of hydrogen peroxide and urea-hydrogen peroxide; and the corrosion inhibitor is selected from the group consisting of 1,2,4-triazole, 5 amino triazole and 1,3,5-Tris (2-hydroxyethyl)isocyanurate.

18. The system of claim 13, wherein the abrasive is silica; the oxidizing agent hydrogen peroxide; and pH of the chemical mechanical planarization composition is from 9 to 11.

* * * * *